United States Patent
Nishihara et al.

(10) Patent No.: US 6,246,155 B1
(45) Date of Patent: Jun. 12, 2001

(54) BIMORPH PIEZOELECTRIC DEVICE FOR ACCELERATION SENSOR AND METHOD OF ITS MANUFACTURE

(75) Inventors: Kazunari Nishihara, Sakai; Kiyotomo Kubota, Kadoma; Hirohumi Tajika, Osaka; Koji Nomura, Shijyonawate; Tetsuro Shimamura, Kyoto; Yukinori Sasaki, Nishinomiya; Masako Yamaguchi, Neyagawa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/147,789
(22) PCT Filed: Jul. 10, 1998
(86) PCT No.: PCT/JP98/03101
§ 371 Date: Mar. 9, 1999
§ 102(e) Date: Mar. 9, 1999
(87) PCT Pub. No.: WO99/02995
PCT Pub. Date: Jan. 21, 1999

(30) Foreign Application Priority Data

Jul. 11, 1997 (JP) .................................................. 9-186332

(51) Int. Cl.[7] .................................................. H01L 41/08
(52) U.S. Cl. ............................................. 310/328; 310/339
(58) Field of Search ................................. 310/328, 348, 310/357, 359, 363, 339, 353

(56) References Cited

U.S. PATENT DOCUMENTS

| 4,494,409 | 1/1985 | Haruyoshi et al. | 73/651 |
|---|---|---|---|
| 5,589,724 | * 12/1996 | Satoh et al. | 310/348 |
| 5,771,555 | * 6/1998 | Eda et al. | 310/348 |
| 5,994,821 | * 11/1999 | Imdad et al. | 310/348 |

FOREIGN PATENT DOCUMENTS

| 4-295770 | 10/1992 | (JP) | G01P/15/09 |
|---|---|---|---|
| 5-172680 | 7/1993 | (JP) | G01L/23/10 |
| 9-026433 | 1/1997 | (JP) | G01P/15/09 |
| 9-243656 | 9/1997 | (JP) | G01P/15/09 |

OTHER PUBLICATIONS

Ohtsuchi et al.: "Shock sensors using direct bonding of LiNbO/sub 3/ crystals" 1996 IEEE Ultrasonics Symposium Proceedings (Cat. No. 96CH35993), 1996 IEEE Ultrasonics Symposium. Proceedings, San Antonio, TX, USA, Nov. 3–6, 1996, pp. 331–334 vol. 1, XP002119144 1996, New York, NY, USA, IEEE, USA ISBN: 0–7803–3615–1.

* cited by examiner

Primary Examiner—Thomas M. Dougherty
(74) Attorney, Agent, or Firm—McDermott, Will & Emery

(57) ABSTRACT

The present invention relates to a bimorph type piezoelectric acceleration sensor used in detecting vibrations of a variety of equipment such as a hard disk, CD-ROM and the like and has the objective of providing a bimorph type piezoelectric element for acceleration sensor of a small size, high sensitivity, a narrow range of sensitivity variation and a low cost by forming a freely vibrating part and a supporting means at the same time in single-piece construction through a grinding away process applied to lithium niobate. One section of a structure formed of two of a lithium niobate single-crystal plate directly bonded together with the polarization directions thereof reversed each other is applied with a grinding away process to produce a freely vibrating part (32a) and the remaining section, where no grinding away process has been applied, serves as a supporting member (33a), thus both being formed simultaneously and made integral with each other, and electrodes (31a, 31b) are formed by electroless plating.

17 Claims, 15 Drawing Sheets

FIG. 4(a)
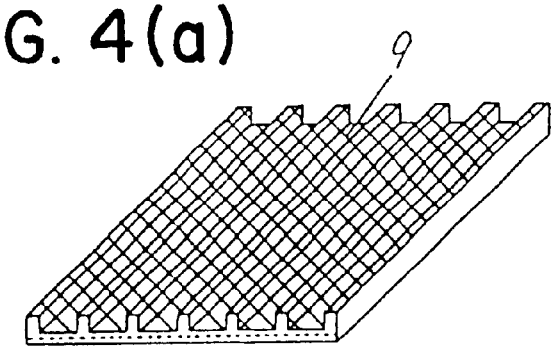
FIG. 4(b)
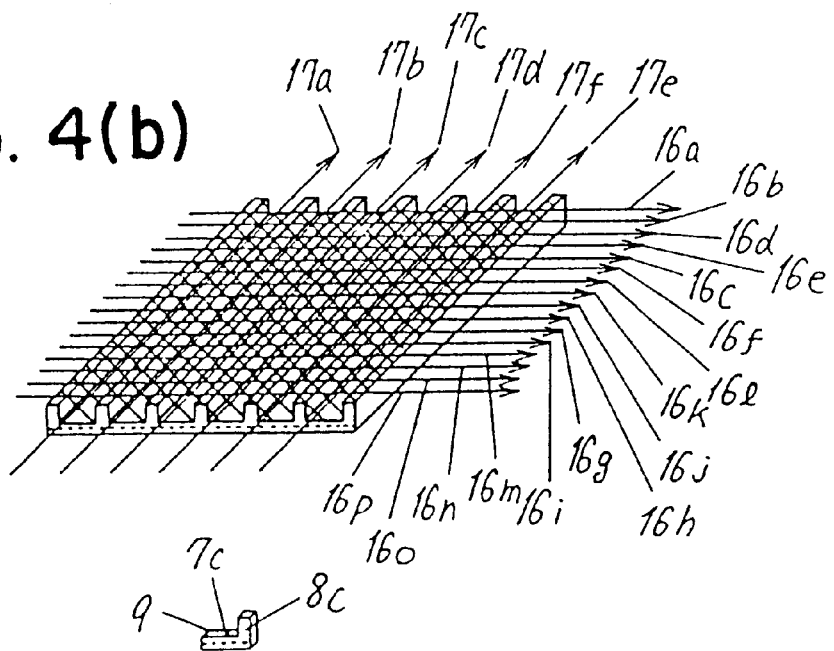
FIG. 4(c)

FIG. 5(d-1) 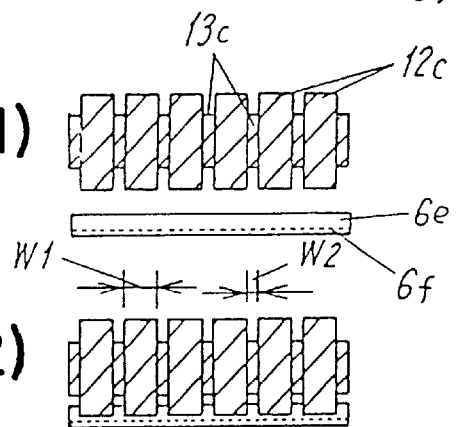
FIG. 5(d-2) 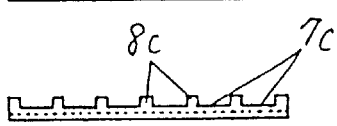
FIG. 5(d-3) 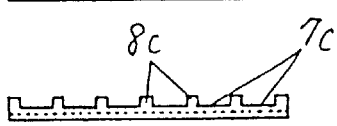

Key to Reference Symbols

| | |
|---|---|
| 1a to 1d | Piezoelectric Ceramic |
| 2a to 2d | Electrode |
| 3a, 3c and 3d | Adhesive |
| 4a, 4c and 4d | Supporting Member |
| 5a and 5b | Polarization Direction |
| 6a to 6f | LN Single-crystal Plate |
| 7a to 7c | Freely Vibrating Part |
| 7h and 7j | Bimorph Type Piezoelectric Element |
| 8a to 8c | Bimorph Type Piezoelectric Element |
| 9 | Electrode |
| 12a to 12c | Grindstone |
| 13a to 13c | Spacer |
| 10, 11, 14, 15, 16 and 17 | Cutting Direction |
| 31a to 31d | Electrode |
| 32a and 32b | Freely Vibrating Part |
| 33a to 33c | Supporting Member |

FIG. 15

BIMORPH PIEZOELECTRIC DEVICE FOR ACCELERATION SENSOR AND METHOD OF ITS MANUFACTURE

FIELD OF THE INVENTION

The present invention relates to a bimorph type piezoelectric element for acceleration sensor that is used in vibration detection of various mechanisms such as a hard disk, CD-ROM and the like and particularly relates to a piezoelectric element for acceleration sensor and its manufacturing method.

BACKGROUND OF THE INVENTION

As the portable type personal computers come into wide use, a shock-proof capability of a hard disk memory device (referred to as HDD hereafter) is considered important. Many methods have been put to the actual use to detect mechanical shocks as acceleration and such detecting means are required to be of a small and thin surface mount type that can be built into the HDD. An acceleration sensor employing piezoelectric ceramic is widely used to satisfy the above requirement. The reason why piezoelectric ceramic can be used as an acceleration sensor is that an applied force F produced in proportion to the acceleration (mechanical shock) a causes distortion to occur in the piezoelectric ceramic and the distortion can be taken out as electrical charge (voltage). This can be expressed by an equation as follows:

$$F = k1 \times \alpha \qquad (1)$$

$$Q(V) = k2 \times F \qquad (2)$$

, where k1 and k2 are constants.

FIG. 12 shows structural examples of the acceleration sensors that use piezoelectric ceramic. FIG. 12(a) shows a bimorph type acceleration sensor of one end supported beam (cantilever) structure and FIG. 12(b) shows a bimorph type acceleration sensor of two end supported beam structure. FIG. 13 shows a method for manufacturing the bimorph type acceleration sensor of cantilever structure of FIG. 12(a) and FIG. 14 shows a method for manufacturing the bimorph type acceleration sensor of two end supported beam structure.

In the foregoing drawings, the reference symbols 1a to 1d indicate piezoelectric ceramic, the reference symbols 2a to 2d indicate electrodes formed on the piezoelectric ceramic, the reference symbols 7h and 7j indicate bimorph type piezoelectric elements, the reference symbols 3a, 3c and 3d indicate adhesives to bond the bimorph type piezoelectric ceramic and the reference symbols 4a, 4c and 4d indicate supporting members to support and fix the bimorph type piezoelectric elements, respectively. In the cantilever structure of FIG. 12(a), a section L1 of the bimorph type piezoelectric element 7h, the section L1 not being fixed to the supporting member 4a, forms a freely vibrating part for acceleration detection, in which distortion occurs in proportion to acceleration and electric charge is generated according to the extent of distortion, and the electric charge thus generated is detected as indicating the magnitude of acceleration. In the two end supported beam structure of FIG. 12(b) also, a section L2 of the bimorph type piezoelectric element 7j, the section L2 not being fixed to the supporting members 4c and 4d, forms a freely vibrating part for acceleration detection in the same way as in FIG. 12(a).

The method for manufacturing these acceleration sensors are as in the following: Pairs of piezoelectric ceramic 1a to 1d, in each respective pair of which polarization is reversed between the opposed pieces of the piezoelectric ceramic, are put together by an adhesive or in the state of green sheet and fired in a single-piece construction, thereby producing bimorph type piezo-electric elements 7h and 7j, which are then attached with supporting members 4a, 4c and 4d by the use of adhesives 3a, 3c and 3d for fixing, respectively, to complete a cantilever structure or a two end supported beam structure.

However, the prior art method of fixing a piezoelectric element to a supporting member or supporting members by adhesion tends to cause a freely vibrating part of the piezoelectric element to exhibit dimensional variations, resulting in not a constant state of anchorage, thereby bringing about the problem of variation in sensitivity against acceleration. When acceleration α is applied to a bimorph type piezoelectric element having a freely vibrating part of a length L, the electrical charge (voltage) Q (V) generated in the bimorph type piezoelectric element is derived from the following equation:

$$Q(V) = k3 \times L^2 \times \alpha \qquad (3)$$

, where k3 is a constant.

Since the generated electrical charge represents the sensor's sensitivity, the equation (3) tells that the sensor's sentivity is proportionate to the square of the length L of the freely vibrating part.

Furthermore, the prior art manufacturing method employs a method of bonding each respective piezoelectric element to a supporting member by an adhesive, thereby having been making a cost reduction difficult to realize.

DISCLOSURE OF THE INVENTION

The present invention deals with the problems as described in the above with the objective of providing a bimorph type piezoelectric element for acceleration sensor that is small in size, high in sensitivity and reduced in sensitivity variations, and the manufacturing method thereof.

In order to achieve the foregoing objective, the bimorph type piezo-electric element for acceleration sensor of the present invention has a bimorph type piezoelectric element for acceleration sensor formed of a pair of piezoelectric single-crystal plates polarized in different directions between the two piezoelectric single-crystal plates and put together face to face by direct bonding, and characterized by having a freely vibrating part formed on at least one of the foregoing pair of piezoelectric single-crystal plates by grinding away partially and also a supporting member or supporting members formed of the part that is not applied with a grinding away process and made integral with the foregoing freely vibrating part at one end or both ends thereof, and the manufacturing method includes:

a first step of direct bonding, whereby the foregoing pair of piezoelectric single-crystal plates are bonded face to face and heated;

a second step of forming a freely vibrating part by grinding away at least one of the directly bonded pair of piezoelectric single-crystal plates in the direction of raows or columns at a predetermined spacing to a predetermined depth;

a third step of forming electrodes on the ground away main surface of the foregoing piezoelectric single-crystal plate; and a fourth step of forming supporting members by cutting both the ground away freely vibrating part and the part that is not applied with a grinding away process at a predetermined spacing in the directions of rows and columns.

According to this invention, a bimorph type piezoelectric element for acceleration sensor that is small in size, high in sensitivity and reduced in variations in sensitivity can be produced at a low cost.

BRIEF DESCRIPTION OF THE DRAWINGS

FIG. 15 shows the key to reference symbols.

PREFERRED EXEMPLARY EMBODIMENTS OF THE INVENTION (First Exemplary Embodiment)

Figure 1A:
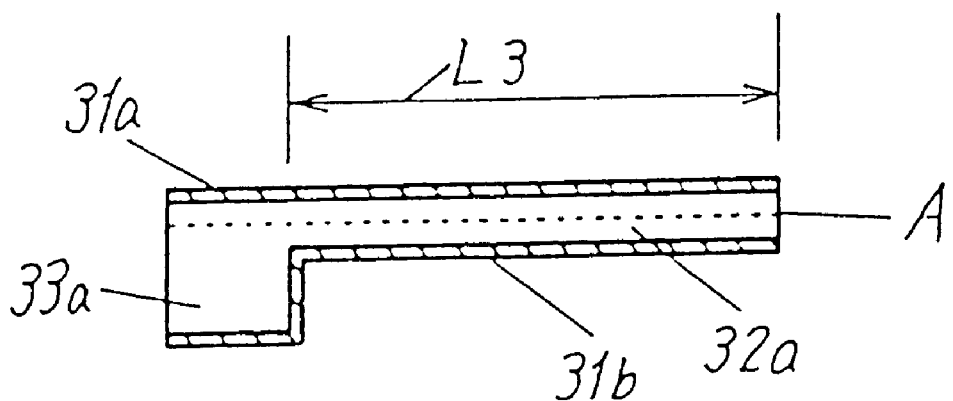
FIG. 1(a) is a cross-sectional view of a bimorph type piezoelectric element for acceleration sensor in a first exemplary embodiment of the present invention and FIG. 1(b) is a perspective view of the bimorph type piezoelectric element of FIG. 1(a).
Figure 1B:
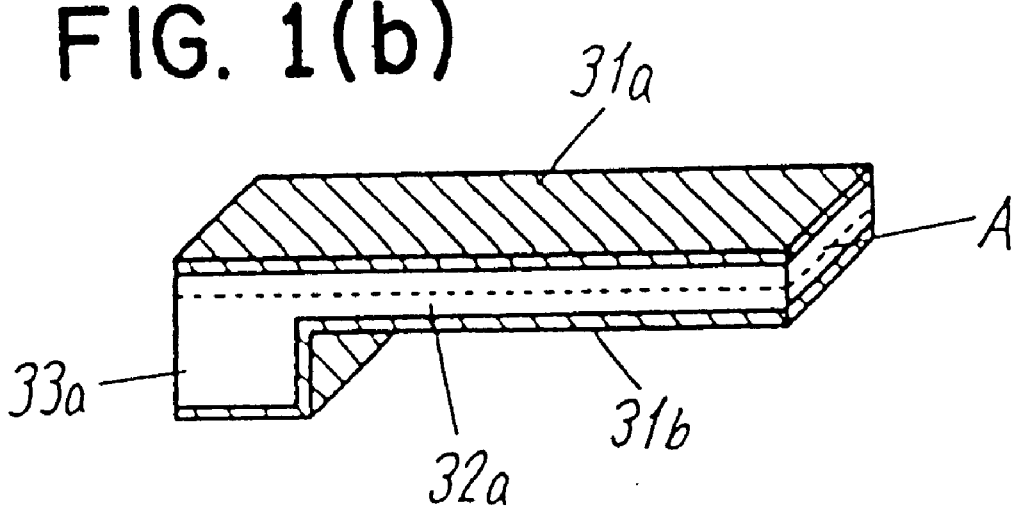

A detailed explanation will be made on a bimorph type piezoelectric element for acceleration sensor in a first exemplary embodiment of the present invention with reference to FIG. 1. FIG. 1(a) is a cross-sectional view of a bimorph type piezoelectric element for acceleration sensor with a cantilever structure and FIG. 1(b) is a perspective view of the same. The reference symbol 32a indicates a freely vibrating part that is formed by grinding away away and makes an acceleration detecting sensor, and the reference symbol 33a indicates a supporting member formed at the same time of the part that was not ground away when the freely vibrating part was formed, thus being made integral with the freely vibrating part 32a. The freely vibrating part 32a was made to measure 0.1 mm in thickness, 2 mm in length L3 and 0.5 mm in width. The thickness of the supporting member 33a was made to measure 0.4 mm. The freely vibrating part 32a is formed of two single-crystal plates of $LiNbO_3$(lithium niobate, referred to as LN hereafter), which are directly bonded together with no adhesive used in such a way as the positively polarized surface of each respective single-crystal plate forming one of the opposing main surfaces is put together with the other face to face.

The two LN single-crystal plates are made completely integral with each other by direct bonding and the bonding surface, where polarization directions are reversed, is indicated by a dotted line A in FIG. 1.

Each of the two LN single-crystal plates that are directly bonded together with the polarization reversed boundary A made a boundary surface is ground away to the same thickness of 0.05 mm. The detection sensitivity S of the sensor is expressed by an inequality of:

$$S > d/\epsilon * \rho * L1 * \alpha$$

, where d: piezoelectric constant, $\epsilon$: dielectric constant, $\rho$: mass density, L1: length of free vibrating part, and $\beta$: constant.

An LN single-crystal plate is an anisotropic material, resulting in a different piezoelectric constant d and a different dielectric constant E according to a cutting plane. Therefore, a 120° to 150° rotation Y plate is obtained in advance by a simulation to maximize d/$\epsilon$, thereby realizing high detection sensitivity. Furthermore, by having the bonding of the single-crystal plates performed so as to have the polarization directions reversed therebetween, generation of electrical charges within the freely vibrating part 32a due to a temperature rise is canceled with a resulting realization of temperature characteristics for excellent sensor sensitivity.

The reference symbols 31a and 31b indicate electrodes for tapping off electrical charges that are generated at the time of acceleration detection. Cr/Au or Ti/Au and the like are desirable as the material for the electrodes in consideration of the adhesion strength with the underlying LN single-crystal plate and the stability of the electrode film. When acceleration is applied to the whole assembly with the supporting member 33a fixed in position, a distortion is created in the freely vibrating part 32a and electrical charges generated in proportion to the distortion are tapped off through the electrodes 31a and 31b, thereb the applied acceleration being detected. Forming a supporting member integrally with a freely vibrating part 32a to look like a step and to form a cantilever structure as a whole without using any adhesives and the like used and also selecting the cutting plane of the LN single-crystal plate so as to maximize the piezoelectric constant d and electromechanical coupling factor k, it was made possible to gain high sensitivity of 6 mV/G, which is two to three times the sensitivity of a bimorph type piezoelectric element for acceleration sensor using ceramic piezoelectric elements.

(Second Exemplary Embodiment)

Figure 2A:
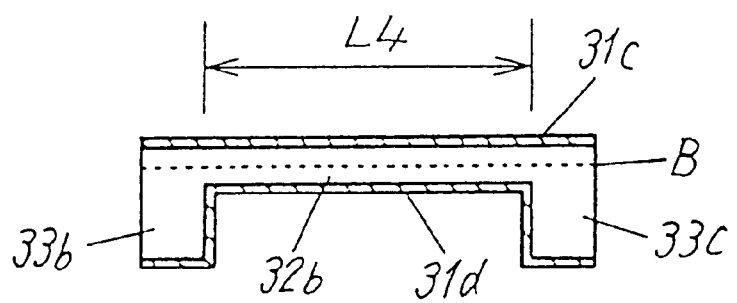
FIG. 2(a) is a cross-sectional view of a bimorph type piezoelectric element for acceleration sensor in a second exemplary embodiment of the present invention and FIG. 2(b) is a perspective view of the bimorph type piezoelectric element of FIG. 2(a).
Figure 2B:
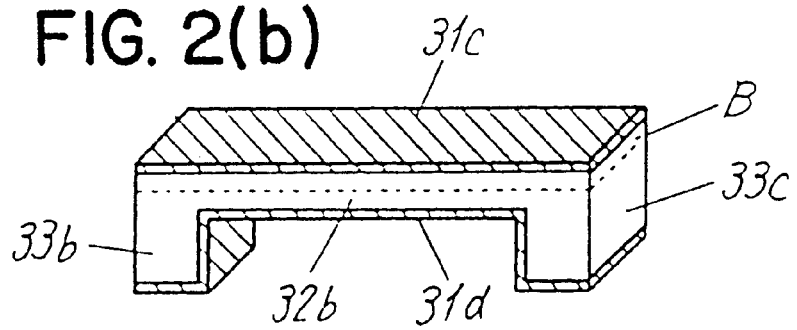
Figure 3A:
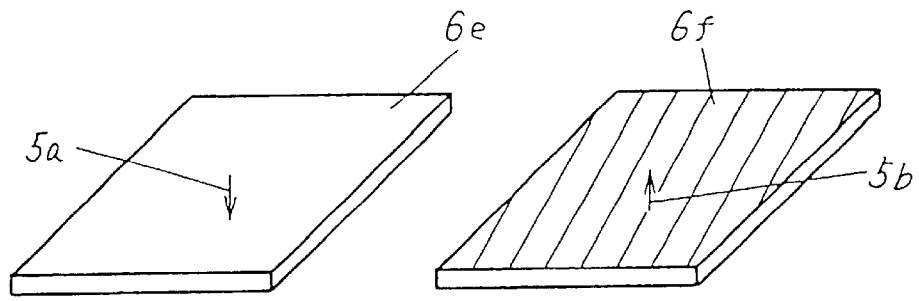
FIG. 3(a–d) shows perspective process views of a method for manufacturing a bimorph type piezoelectric element for acceleration sensor in a third exemplary embodiment of the present invention, FIG. 4(e–g) is a continuation of FIG. 3 and FIG. 5(a–g) shows cross-sectional views of the manufacturing steps of FIG. 3 and FIG. 4.
Figure 3B:
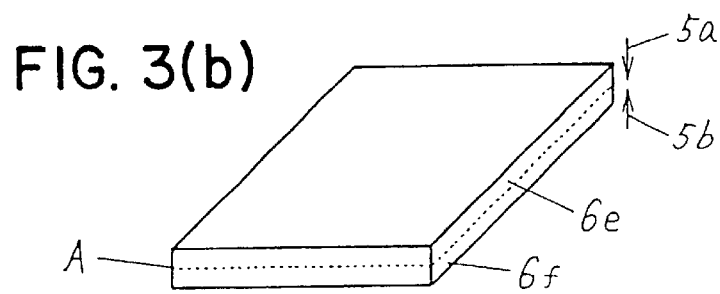
Figure 3C:
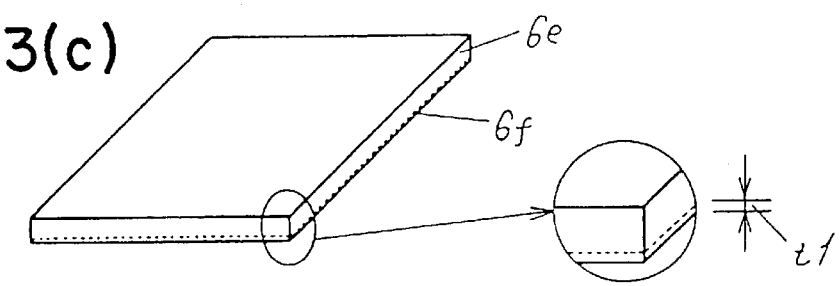
Figure 3D:
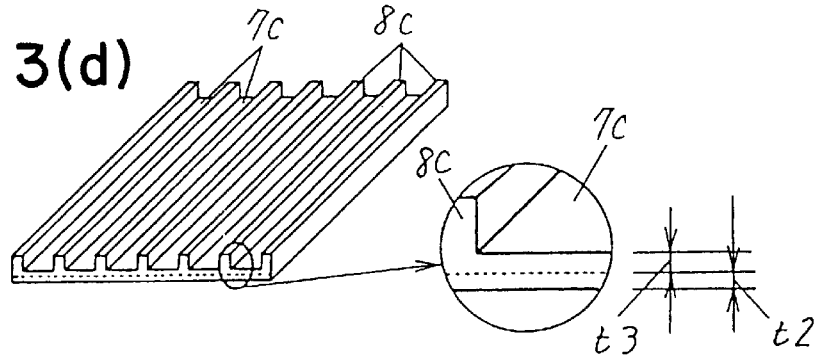
Figure 5A:
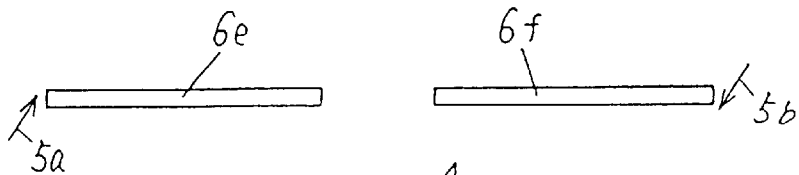
Figure 5B:
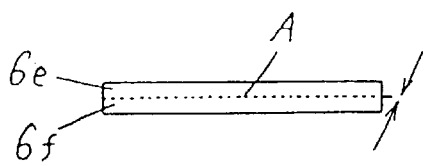
Figure 5C:
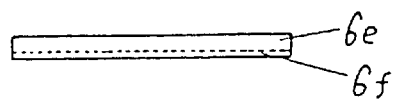
Figure 5E:
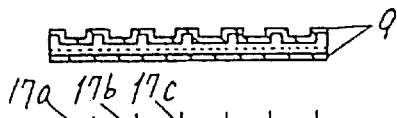
Figure 5F:
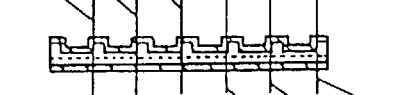
Figure 5G:
Figure 6A:
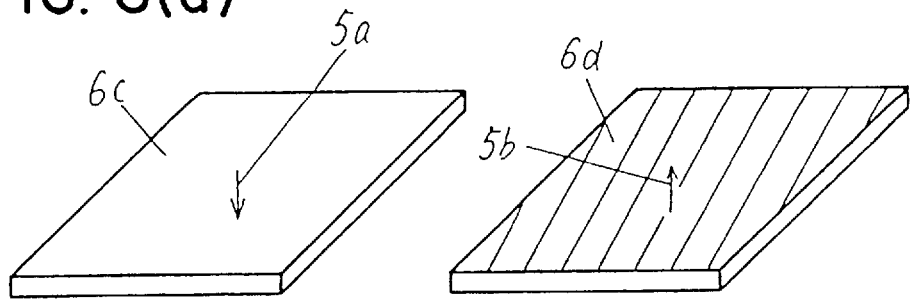
FIG. 6(a–d) shows perspective process views of a method for manufacturing a bimorph type piezoelectric element for acceleration sensor in a fourth exemplary embodiment of the present invention, FIG. 7(e–g) is a continuation of FIG. 6 and FIG. 8(a–g) shows cross-sectional views of the manufacturing processes of FIG. 6 and FIG. 7.
Figure 6B:
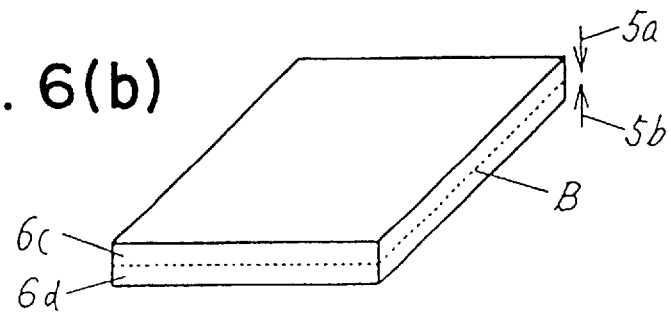
Figure 6C:
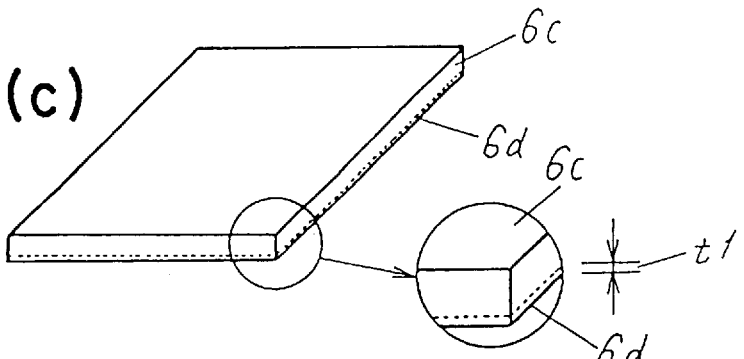
Figure 6D:
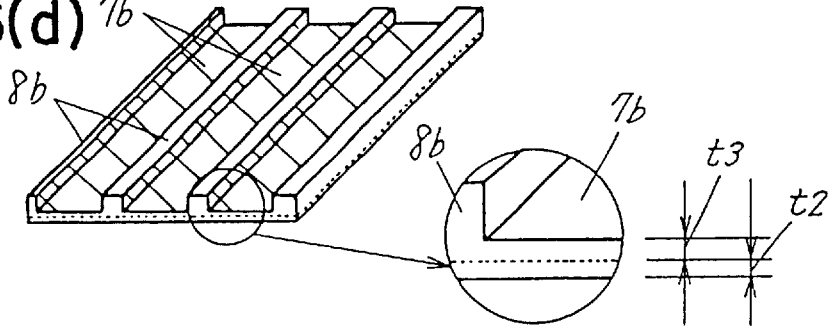

A detailed explanation will be made on a bimorph type piezoelectric element for acceleration sensor in a second exemplary embodiment of the present invention with reference to FIG. 2. FIG. 2(a) is a cross-sectional view of a bimorph type piezoelectric element for acceleration sensor with a two end supported beam structure and FIG. 2(b) is a perspective view of the same.

The reference symbol 32b indicates a freely vibrating part that is formed by grinding away and makes an acceleration detecting sensor, and the reference symbols 33b and 33c indicate supporting members formed, at the same time, of the part that was not ground away when the freely vibrating part was formed, thus being made integral with the freely vibrating part 32b. The freely vibrating part 32b was made to measure 0.1 mm in thickness, 2 mm in length LA and 0.5 mm in width. The thickness of each of the supporting members 33b and 33c was made to measure 0.4 mm. The freely vibrating part 32b is formed of two single-crystal plates of LN, which are directly bonded together with no adhesive used in such a way as the positively polarized surface of each respective single-crystal plate, which forms an opposing main surface is put together with the other face to face.

The two LN single-crystal plates are made completely integral with each other by direct bonding and the bonding surface, where polarization directions are reversed, is indicated by a dotted line B in FIG. 2.

Each of the two LN single-crystal plates that are directly bonded together with the polarization reversed boundary B made the threshold therebetween is ground away to the same thickness of 0.05 mm. The detection sensitivity S of the sensor is expressed by an inequality of.

$$S > d/\epsilon * \rho * L1 * \alpha$$

, where d: piezoelectric constant, $\epsilon$: dielectric constant, $\rho$: mass density, L1: length of free vibrating part, and $\beta$: constant.

An LN single-crystal plate is an anisotropic material, resulting in a different piezoelectric constant d and a different dielectric constant $\epsilon$ according to a cutting plane. Therefore, a 120° to 150° rotation Y plate is obtained in advance by a simulation to maximize d/$\epsilon$, thereby realizing high detection sensitivity. Furthermore, by having the bonding of the single-crystal plates performed so as to reverse the polarization direction, generation of electrical charges within the freely vibrating part 32b due to a temperature rise is canceled with a resulting realization of temperature characteristics for excellent sensor sensitivity.

The reference symbols 31c and 31d indicate electrodes for tapping off electrical charges that are generated at the time of acceleration detection. Cr/Au or Ti/Au and the like are desirable as the material for the electrodes in consideration of the adhesion strength with the underlying LN single-crystal plate and the stability of the electrode film. When acceleration is applied to the whole assembly with the supporting members 33b and 33c fixed in position, a distortion is created in the freely vibrating part 32b and electrical charges generated in proportion to the distortion are tapped off through the electrodes 31c and 31d, thereby the applied acceleration being detected. Forming supporting members integrally with a freely vibrating part 32b with each respective supporting member looking like a step to form a two end supported beam structure as a whole without using any adhesives and the like and also selecting the cutting plane of the LN single-crystal plate so as to maximize the piezoelectric constant d and electromechanical coupling factor k, it was made possible to gain high sensitivity, which is two to three times the sensitivity of a bimorph type piezoelectric element for acceleration sensor using ceramic piezoelectric elements.

(Third Exemplary Embodiment)

A detailed explanation will be made on a method for manufacturing a bimorph type piezoelectric element for acceleration sensor in a third exemplary embodiment of the present invention with reference to FIG. 3 to FIG. 5. FIG. 3 and FIG. 4 show perspective process views of the foregoing manufacturing method and FIG. 5 shows cross-sectional views of the manufacturing steps of FIG. 3 and FIG. 4. The reference symbols 6e and 6f indicate an LN single-crystal plate, respectively, and the reference symbols 5a and 5b indicate polarization directions of the LN single-crystal plates, respectively. The dotted lines in the drawings indicate a polarization reversed boundary A, where two LN single-crystal plates are directly bonded together with the polarization directions thereof reversed from each other. The reference symbol 7c indicates a freely vibrating part (formed by grinding away) and the reference symbol 8c indicates a supporting member (prepared with no grinding away applied). The reference symbol 12c indicates grindstones used for grinding away and the reference symbol 13c indicates spacers for fixing the position of the grindstones 12c with a predetermined spacing provided therebetween. The reference symbol 9 indicates an electrode formed on the main surface of the two LN single-crystal plates that have been directly bonded together and the reference symbols 17a to 17f and 16a to 16p indicate cutting directions.

The method for manufacturing a bimorph type piezoelectric element for acceleration sensor in the present exemplified embodiment starts with putting together the two LN single-crystal plates 6e and 6f after cleaning each respective surface thereof and then applying heat to the combined two plates to directly bond the two plates together. (Steps a to b)

The thickness of each respective LN single-crystal plate is determined in consideration of the final configuration. In this case, two LN single-crystal plates, each measuring 0.35 mm in thickness, for example, are directly bonded together. The steps of cleaning and putting together of the two plates are preferred to be performed in a clean room in order to keep dust from entering between two opposing main surfaces of the plates, to be directly bonded together. In addition, the two opposing main surfaces of the LN single-crystal plates are both made positive in polarity. The detection sensitivity of the sensor is expressed by an inequality of:

$$S > d/\epsilon * \rho * L1 * \alpha$$

, where d: piezoelectric constant, $\epsilon$: dielectric constant, $\rho$: mass density, L1: length of free vibrating part, and $\beta$: constant.

An LN single-crystal plate is an anisotropic material, resulting in a different piezoelectric constant d and a different dielectric constant e according to a cutting plane. Therefore, a 120° to 150° rotation Y plate is obtained in advance by a simulation to maximize d/$\epsilon$, thereby realizing high detection sensitivity. Furthermore, by having the bonding of the single-crystal plates performed so as to have the two opposing main surfaces made both positive in polarity, generation of electrical charges due to a temperature rise is canceled with a resulting realization of temperature characteristics for excellent sensor sensitivity. Additionally, by having the amount of displacement of each respective plate from the x axis or z axis limited within ±1° when the bonding is performed, the bonding strength can be enhanced, resulting in an improvement in the shock resistance of an acceleration sensor. As a result of tensile tests, the temperature of the heat that is applied after the two plates are put together is made 275° C. or higher, where a destruction mode does not take place in the bonded boundary but bulk destruction is caused to occur. The upper limit of the heating temperature can be extended to near 1150° C., which corresponds to the Curie temperature of LN. Costs of the equipment involved can be reduced by performing the heating in vacuum or in the atmosphere. Upon completion of the heating, the pair of LN single-crystal plates 6e and 6f that have been bonded together are completely made integral with each other although the polarity reversed boundary A forming a bonding plane is indicated by a dotted line in the drawings.

Next, one of the LN single-crystal plates directly bonded is scraped to an extent of 0.3 mm by means of a lapping method, a surface grinding away method or the like until the thickness t1 to the polarity reversed boundary reaches 0.05 mm. (Step c) If an LN single-crystal plate of 0.05 mm thick is used for the direct bonding, this Step c can be omitted.

Then, the other surface of the LN single-crystal plate formed by direct bonding is ground away by using the grindstone 12c with a thickness of W1 to produce the freely vibrating parts 7c, each of which makes a sensor element and is made simultaneously and integral with the supporting member 8c that is prepared with no grinding away applied and intended for supporting a cantilever beam. (Step d) At least one or more of the grindstone 12c is used in grinding away and the grindstone's width W1 and the width W2 of a spacer for fixing grindstones are determined in consideration of the length of the freely vibrating part 7c and the length of the supporting member 8c. In this case, W1 is made 2 mm, W2 is made 0.5 mm, the length of the freely vibrating part 7c is made 2 mm and the length of the supporting member 8c is made 0.5 mm. By making the extent of grinding away from the surface measure 0.3 mm and the thickness of the freely vibrating part 7c measure 0.1 mm, the grinding away is performed so as to make the thicknesses t2 and t3 of respective LN single-crystal plates, which are directly bonded each other with the polarity reversed boundary A serving as the threshold therebetween, the same 0.05 mm. By making the thicknesses t2 and t3 the same with each other, high sensitivity has been realized.

Next, electrodes 9 for detecting electrical charges are formed on both the front and back surfaces of the LN single-crystal plate produced through a grinding away process. (Step e) In this case, the electrodes 9 are formed by vapor deposition or electroless plating and it is preferred to employ Cr/Au or Ti/Au as the electrode material in consideration of the adhesion strength with the LN single-crystal plate.

Then, the LN single-crystal plate is cut in a matrix format by dicing or by the use of a slicer as indicated by the reference symbols 17a to 17f and 16a to 16p to produce bimorph type piezoelectric elements for acceleration sensor, each having a cantilever beam structure provided with a supporting member 8c and a freely vibrating part 7c. (Step f) When the foregoing cutting process is performed, it is needed to use at least one or more of cutting edge and the spacing between the edges has to be determined in consideration of the configuration of the sensor to be produced. In this particular case, a bimorph type piezoelectric element for acceleration sensor of an extremely small size of 2.5 mm long, 0.5 mm wide and 0.4 mm thick has been realized by employing a spacing of 2.5 mm between the respective adjoining reference symbols of 17a to 17f and a spacing of 0.5 mm between the respective adjoining reference symbols of 16a to 16p. Since the length of the freely vibrating part 7c is determined according to the accuracy of grindstones 12c that are employed and the machine accuracy that is applicable at the time of grinding away and cutting, a very good accuracy of ±3% has been achieved in the variations in sensor sensitivity with the present invention in comparison with the conventional method of fixing the supporting member with the use of adhesives, whereby the variations in sensor sensitivity have been made as wide as ±20%. With respect to the average time required to fix a supporting member, it takes 5 minutes per a unit of the supporting member according to the conventional method of bonding while taking only 0.01 minutes with the present invention, which correspond to a great reduction to 1/50 of the time needed by the conventional method of bonding (even when one grind stone is used in the grinding away process). Thus, the present invention can provide a method for manufacturing a bimorph type piezoelectric element of cantilever beam structure for acceleration sensor exhibiting a narrow range of variation in sensitivity and also achieving a low cost.

(Fourth Exemplary Embodiment)

Figure 7A:
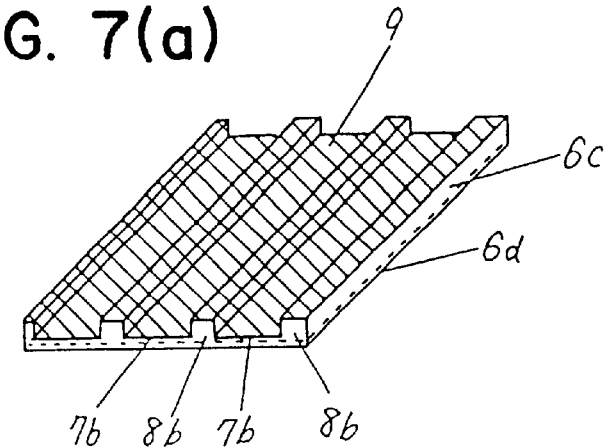
Figure 7B:
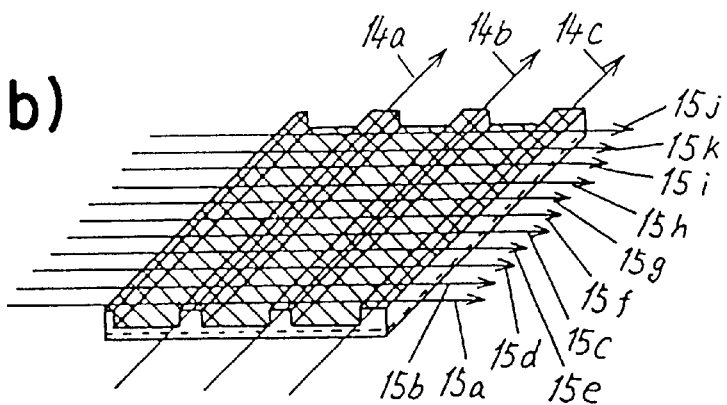
Figure 7C:
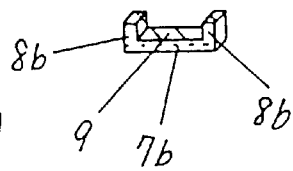
Figure 8A:
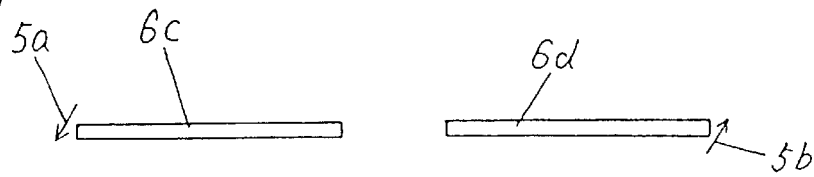
Figure 8B:
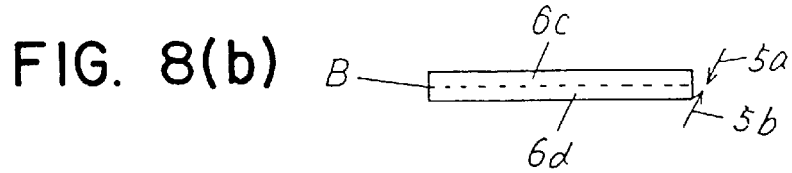
Figure 8C:
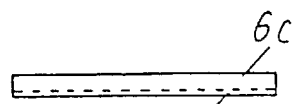
Figure 8C:
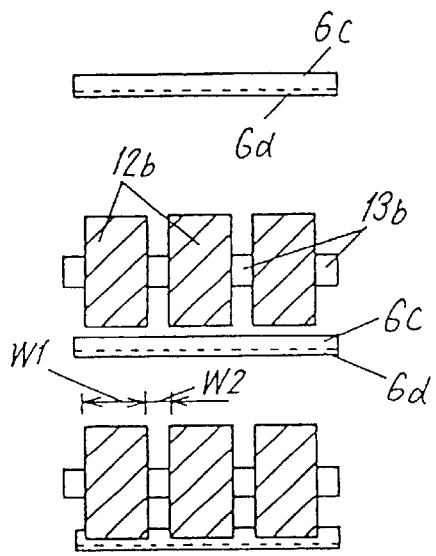
Figure 8C:
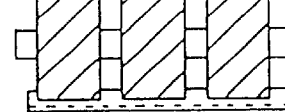
Figure 8E:
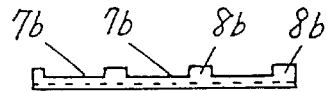
Figure 8F:
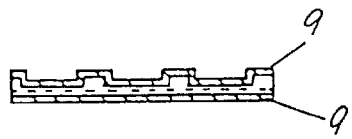
Figure 8G:
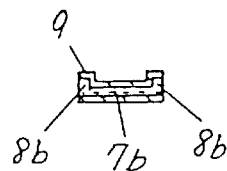
Figure 9A:
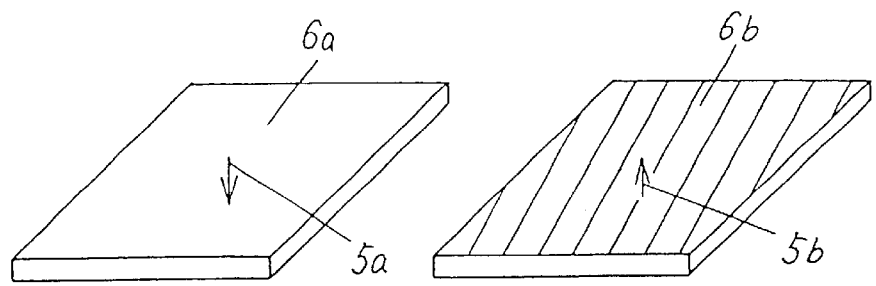
FIG. 9 shows perspective process views of a method for manufacturing a bimorph type piezoelectric element for acceleration sensor in a fifth exemplary embodiment of the present invention, FIG. 10(e–g) is a continuation of FIG. 9(a–d) and FIG. 11(a–g) shows cross-sectional views of the manufacturing processes of FIG. 9 and FIG. 10.
Figure 9B:
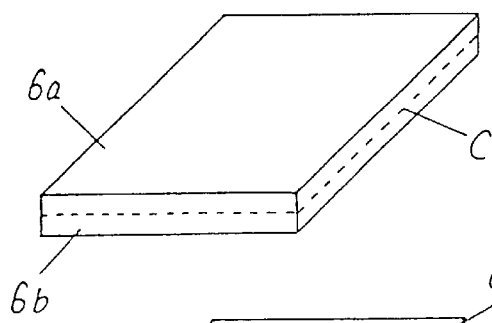
Figure 9C:
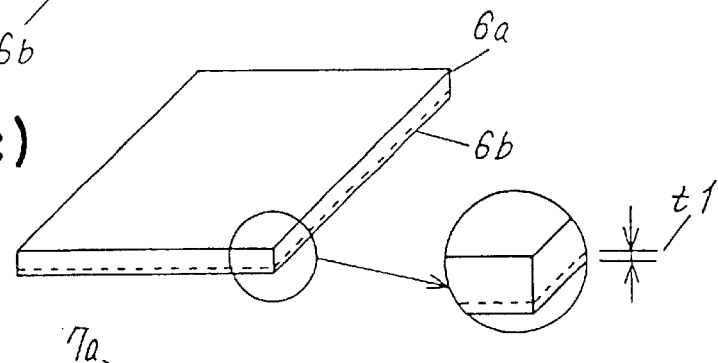
Figure 9D:
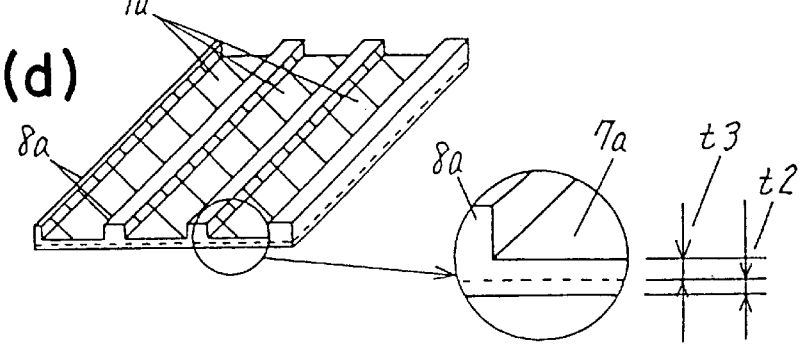

A detailed explanation will be made on a method for manufacturing a bimorph type piezoelectric element for acceleration sensor in a fourth exemplary embodiment of the present invention with reference to FIG. 6 to FIG. 8. FIG. 6 and FIG. 7 show perspective process views of the foregoing manufacturing method and FIG. 8 shows cross-sectional views of the manufacturing steps of FIG. 6 and FIG. 7. The reference symbols 6c and 6d indicate an LN single-crystal plate, respectively, and the reference symbols 5a and 5b indicate polarization directions of the LN single-crystal plates, respectively. The dotted lines in the drawings indicate a polarization reversed boundary B, where two LN single-crystal plates are directly bonded together with the polarization directions thereof reversed from each other. The reference symbol 7b indicates a freely vibrating part (formed by grinding away) and the reference symbol 8b indicates a supporting member (prepared with no grinding away applied). The reference symbol 12b indicates grindstones used for grinding away and the reference symbol 13b indicates spacers for fixing the position of the grindstones 12b with a predetermined spacing provided therebetween. The reference symbol 9 indicates an electrode formed on the main surface of the two LN single-crystal plates that have been directly bonded together and the reference symbols 14a to 14c and 15a to 15k indicate cutting directions.

The method for manufacturing a bimorph type piezoelectric element for acceleration sensor in the present exemplified embodiment starts with putting together the two LN single-crystal plates 6c and 6d after cleaning each respective surface thereof and then applying heat to the combined two plates to directly bond the two plates together. (Steps a to b)

The thickness of each respective LN single-crystal plate is determined in consideration of the final configuration. In this case, two LN single-crystal plates, each measuring 0.35 mm in thickness, for example, are directly bonded together. The steps of cleaning and putting together of the two plates are preferred to be performed in a clean room in order to keep dust from entering between the two opposing main surfaces of the plates, which are directly bonded together. In addition, the two opposing main surfaces of the LN single-crystal plates are both made positive in polarity. The detection sensitivity of the sensor is expressed by an inequality of:

$$S > d/\epsilon * \rho * L1 * \alpha$$

, where d: piezoelectric constant, $\epsilon$: dielectric constant, $\rho$: mass density, L1: length of free vibrating part, and $\beta$: constant.

An LN single-crystal plate is an anisotropic material, resulting in a different piezoelectric constant d and a different dielectric constant $\epsilon$ according to a cutting plane. Therefore, a 120° to 150° rotation Y plate is obtained in advance by a simulation to maximize d/$\epsilon$, thereby realizing high detection sensitivity. Furthermore, by having the bonding of the single-crystal plates performed so as to have the two opposing main surfaces made both positive in polarity, generation of electrical charges due to a temperature rise is canceled with a resulting realization of temperature characteristics for excellent sensor sensitivity. Additionally, by having the amount of displacement of each respective plate from the x axis or z axis limited within ±1° when the bonding is performed, the bonding strength can be enhanced, thereby obtaining an improvement in the shock resistance of a resulting acceleration sensor. As a result of tensile tests, the temperature of the heat that is applied after the two plates are put together is made 275° C. or higher, where a destruction mode does not take place in the bonded boundary but bulk destruction is caused to occur. The upper limit of the heating temperature can be extended to near 1150° C., which corresponds to the Curie temperature of LN. Costs of the equipment involved can be reduced by performing the heating in vacuum or in the atmosphere. Upon completion of the heating, the pair of LN single-crystal plates 6c and 6d that have been bonded together are completely made integral with each other although the polarity reversed boundary B forming a bonding plane is indicated by a dotted line in the drawings.

Next, one of the surfaces of the LN single-crystal plate formed by direct bonding is scraped to an extent of 0.3 mm by means of a lapping method, a surface grinding away method or the like until the thickness t1 from the polarity reversed boundary reaches 0.05 mm. (Step c) If an LN single-crystal plate of 0.05 mm thick is used for the direct bonding, this Step c can be omitted.

Then, the other surface of the LN single-crystal plate formed by direct bonding is ground away by using the grindstone 12c with a thickness of W1 to produce the freely vibrating parts 7c, each of which makes a sensor element and is made simultaneously and integral with the supporting member 8b that is prepared with no grinding away applied and intended for a supporting member with a two end supported beam. (Step d) At least one or more of the grindstone 12b is used in grinding away and the grindstone's width W1 and the width W2 of a spacer for fixing grindstones are determined in consideration of the length of the freely vibrating part 7b and the length of the supporting member 8b. In this case, W1 is made 2 mm, W2 is made 0.5 mm, the length of the freely vibrating part 7b is made 2 mm and the length of the supporting member 8b is made 0.5 mm. By making the extent of grinding away from the surface measure 0.3 mm and the thickness of the freely vibrating part 7b measure 0.1 mm, the grinding away is performed so as to make the thicknesses t2 and t3 of respective LN single-crystal plates, which are directly bonded each other with the polarity reversed boundary B serving as the threshold therebetween, the same 0.05 mm. By making the thicknesses t2 and t3 the same with each other, high sensitivity has been realized.

Next, electrodes 9 for detecting electrical charges are formed on both the front and back surfaces of the LN single-crystal plate produced through a grinding away process. (Step e) In this case, the electrodes 9 are formed by vapor deposition or electroless plating and it is preferred to employ Cr/Au or Ti/Au as the electrode material in consideration of the adhesion strength with the IN single-crystal plate.

Then, the IN single-crystal plate is cut in a matrix format by dicing or by the use of a slicer as indicated by the reference symbols 14a to 14c and 15a to 15k to produce bimorph type piezoelectric elements for acceleration sensor, each having a two end supported beam structure provided with a supporting member 8b and a freely vibrating part 7b.

(Step f) When the foregoing cutting process is performed, it is needed to use at least one or more of cutting edge and the spacing between the edges has to be determined in consideration of the configuration of the sensor to be produced. In this particular case, a bimorph type piezoelectric element for acceleration sensor of an extremely small size of 2.5 mm long, 0.5 mm wide and 0.4 mm thick has been realized by employing a spacing of 2.5 mm between the respective adjoining reference symbols of 14a to 14c and a spacing of 0.5 mm between the respective adjoining reference symbols of 15a to 15k. Since the length of the freely vibrating part 7b is determined according to the accuracy of grindstones 12b that are employed and also the machine accuracy that is applicable at the time of grinding away and cutting, a very good accuracy of ±3% has been achieved in the variations in sensor sensitivity with the present invention in comparison with the conventional method of fixing the supporting member with the use of adhesives, whereby the variations in sensor sensitivity have been made as wide as ±20%. With respect to the average time required to fix a supporting member, it takes 5 minutes per a unit of the supporting member according to the conventional method of bonding while taking only 0.01 minutes with the present invention, which correspond to a great reduction to 1/50 of the time needed by the conventional method of bonding (even when one grind stone is used in the grinding away process). Thus, the present invention can provide a method for manufacturing a bimorph type piezoelectric element of two end supported beam structure for acceleration sensor exhibiting a narrow range of variation in sensitivity and also achieving a low cost.

(Fifth Exemplary Embodiment)

Figure 10A:
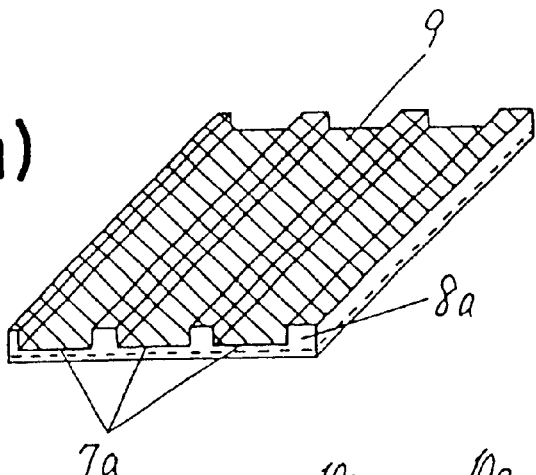
Figure 10B:
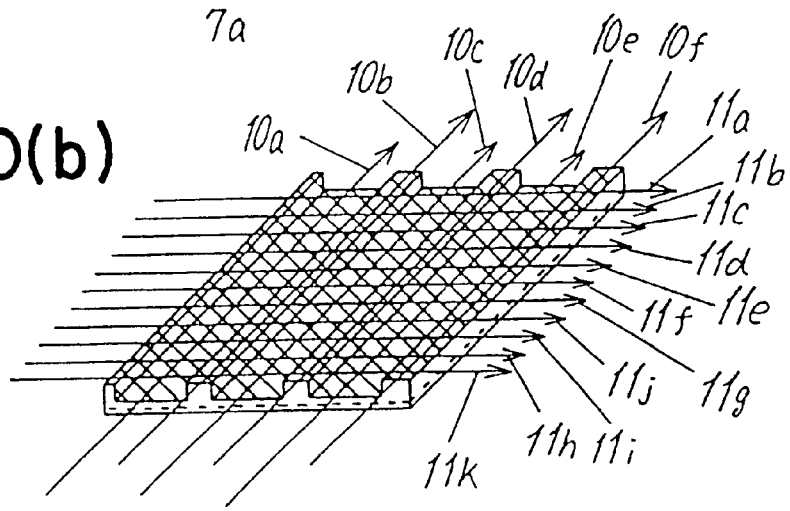
Figure 10C:
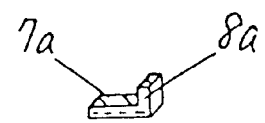
Figure 11A:
Figure 11B:
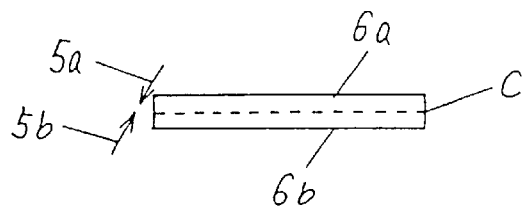
Figure 11C:
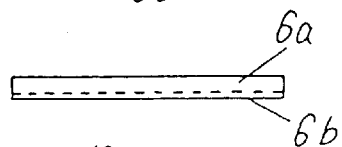
Figure 11C:
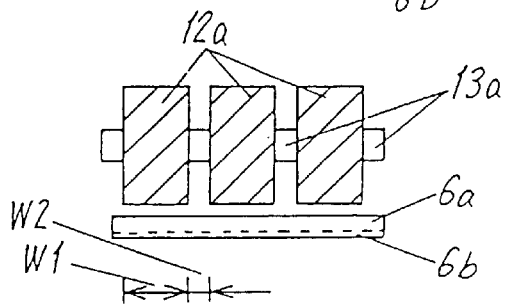
Figure 11C:
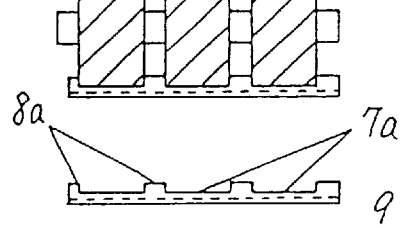
Figure 11E:
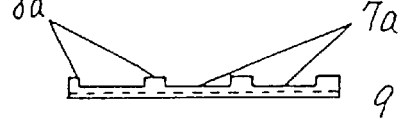
Figure 11F:
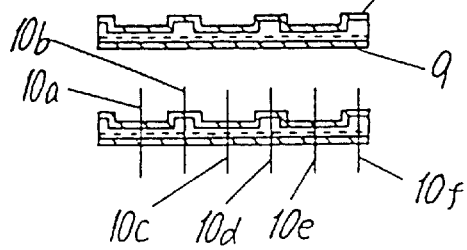
Figure 11G:
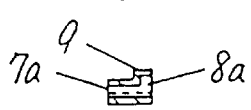
Figure 12A:
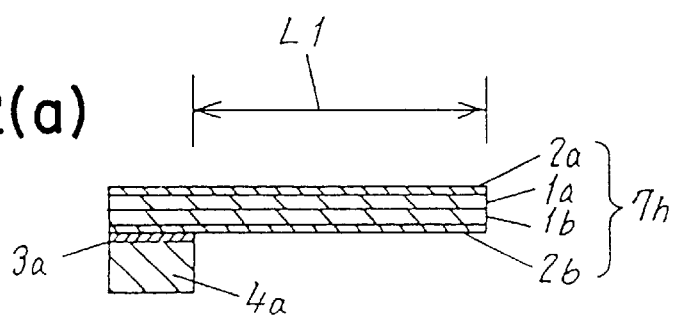
FIG. 12(a) is a cross-sectional view of a prior art bimorph type piezoelectric element for acceleration sensor (cantilever structure) and FIG. 12(b) is a cross-sectional view of a bimorph type piezoelectric element for acceleration sensor (two end supported beam structure) with a prior art structure.
Figure 12B:
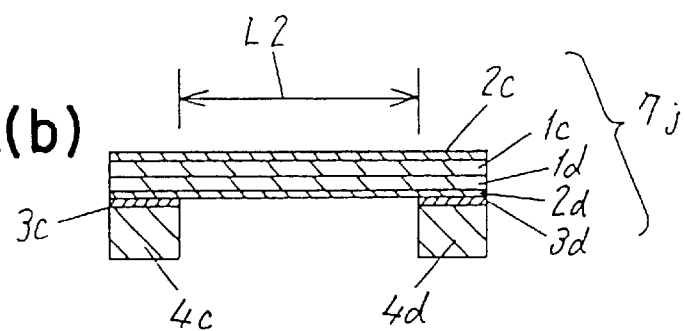
Figure 13A:
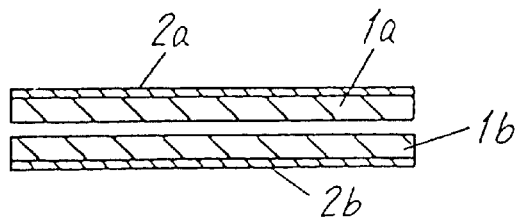
FIG. 13(a–d) shows cross-sectional process views of a typical method for manufacturing a bimorph type piezoelectric element for acceleration sensor (cantilever structure) according to a prior art process.
Figure 13B:
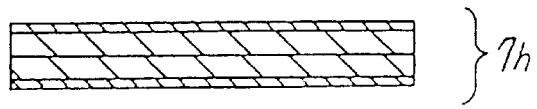
Figure 13C:
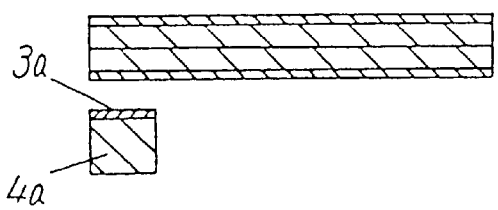
Figure 13D:
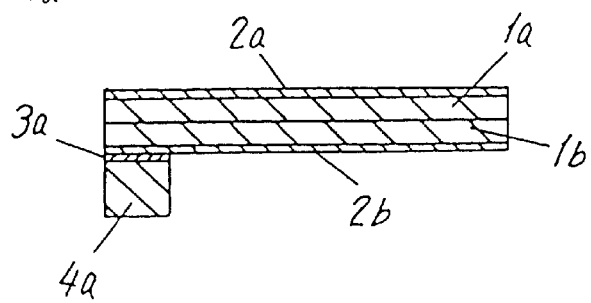
Figure 14A:
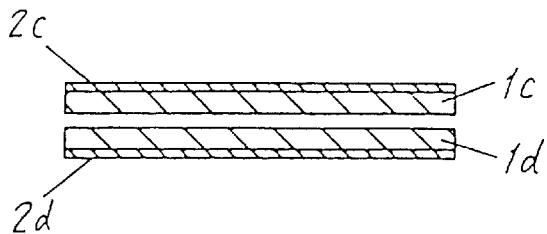
FIG. 14(a–d) shows cross-sectional process views of a typical method for manufacturing a bimorph type piezoelectric element for acceleration sensor (two end supported beam structure) according to a prior art process.
Figure 14B:
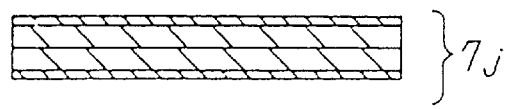
Figure 14C:
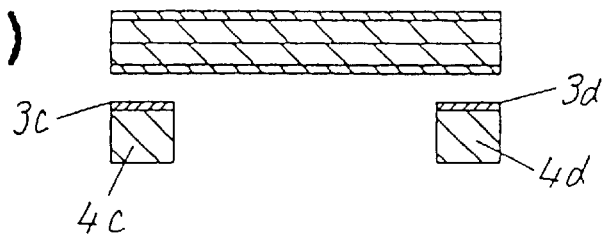
Figure 14D:
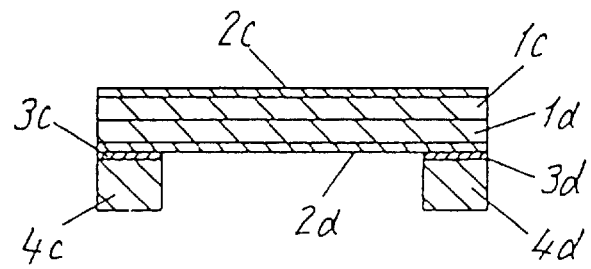

A detailed explanation will be made on a method for manufacturing a bimorph type piezoelectric element for acceleration sensor in a fifth exemplary embodiment of the present invention with reference to FIG. 9 to FIG. 11. FIG. 9 and FIG. 10 show perspective process views of the foregoing manufacturing method and FIG. 11 shows cross-sectional views of the manufacturing steps of FIG. 9 and FIG. 10. The reference symbols 6a and 6b indicate an LN single-crystal plate, respectively, and the reference symbols 5a and 5b indicate polarization directions of the LN single-crystal plates, respectively. The dotted lines in the drawings indicate a polarization reversed boounbary C, where two LN single-crystal plates are directly bonded together with the polarization directions thereof reversed from each other. The reference symbol 7a indicates a freely vibrating part (formed by grinding away) and the reference symbol 8a indicates a supporting member (prepared with no grinding away applied). The reference symbol 12a indicates grindstones used for grinding away and the reference symbol 13a indicates spacers for fixing the position of the grindstones 12a with a predetermined spacing provided therebetween. The reference symbol 9 indicates an electrode formed on the main surface of the two LN single-crystal plates that have been directly bonded together and the reference symbols 10a to 10f and 11a to 11k indicate cutting directions.

The method for manufacturing a bimorph type piezoelectric element for acceleration sensor in the present exemplified embodiment starts with putting together the two LN single-crystal plates 6a and 6b after cleaning each respective surface thereof and then applying heat to the combined two plates to directly bond the two plates together (Steps a to b).

The thickness of each respective LN single-crystal plate is determined in consideration of the final configuration. In this case, two LN single-crystal plates, each measuring 0.35 mm in thickness, for example, are directly bonded together. The steps of cleaning and putting together of the two plates are preferred to be performed in a clean room in order to keep dust from entering between two opposing main surfaces of the plates, which are directly bonded together. In addition, the two opposing main surfaces of the LN single-crystal plates are both made positive in polarity. The detection sensitivity of the sensor is expressed by an inequality of:

$$S > d/\epsilon * \rho * L1 * \alpha$$

, where d: piezoelectric constant, $\epsilon$: dielectric constant, $\rho$: mass density, L1: length of free vibrating part, and $\beta$: constant.

An LN single-crystal plate is an anisotropic material, resulting in a different piezoelectric constant d and a different dielectric constant $\epsilon$ according to a cutting plane. Therefore, a 120° to 150° rotation Y plate is obtained in advance by a simulation to maximize d/$\epsilon$, thereby realizing high detection sensitivity. Furthermore, by having the bonding of the single-crystal plates performed so as to have the two opposing main surfaces made both positive in polarity, generation of electrical charges due to a temperature rise is canceled with a resulting realization of temperature characteristics for excellent sensor sensitivity. Additionally, by having the amount of displacement of each respective plate from the x axis or z axis limited within ±1° when the bonding is performed, the bonding strength can be enhanced, thereby obtaining an improvement in the shock resistance of a resulting acceleration sensor. As a result of tensile tests, the temperature of the heat that is applied after the two plates are put together is made 275° C. or higher, where a destruction mode does not take place in the bonded boundary but bulk destruction is caused to occur. The upper limit of the heating temperature can be extended to near 1150° C., which corresponds to the Curie temperature of LN. Costs of the equipment involved can be reduced by performing the heating in vacuum or in the atmosphere. Upon completion of the heating, the pair of LN single-crystal plates 6a and 6b that have been bonded together are completely made integral with each other although the polarity reversed boundary C forming a bonding plane is indicated by a dotted line in the drawings.

Next, one of the surfaces of the LN single-crystal plate formed by direct bonding is scraped to an extent of 0.3 mm by means of a lapping method, a surface grinding away method or the like until the thickness t1 from the polarity reversed boundary reaches 0.05 mm. (Step c) If an LN single-crystal plate of 0.05 mm thick is used for the direct bonding, this Step c can be omitted.

Then, the other surface of the LN single-crystal plate formed by direct bonding is ground away by using the grindstone 12a with a thickness of W1 to produce the freely vibrating parts 7a, each of which makes a sensor element and is made simultaneously and integral with the supporting member 8a that is prepared with no grinding away applied and intended for a supporting member of a cantilever beam. (Step d) At least one or more of the grindstone 13a is used in grinding away and the grindstone's width W1 and the width W2 of a spacer for fixing grindstones are determined in consideration of the length of the freely vibrating part 7a and the length of the supporting member 8a. In this case, W1 is made 4.0 mm, W2 is made 1.0 mm, the length of the freely vibrating part 7a is made 4.0 mm and the length of the supporting member 8a is made 1.0 mm. By making the extent of grinding away from the surface measure 0.3 mm and the thickness of the freely vibrating part 7a measure 0.1 mm, the grinding away is performed so as to make the thicknesses t2 and t3 of respective LN single-crystal plates, which are directly bonded each other with the polarity reversed boundary C serving as the threshold therebetween, the same 0.05 mm. By making the thicknesses t2 and t3 the same with each other, high sensitivity has been realized.

Next, electrodes 9 for detecting electrical charges are formed on both the front and back surfaces of the LN single-crystal plate produced through a grinding away process. (Step e) In this case, the electrodes 9 are formed by vapor deposition or electroless plating and it is preferred to employ Cr/Au or Ti/Au as the electrode material in consideration of the adhesion strength with the LN single-crystal plate.

Then, the LN single-crystal plate is cut in a matrix format by dicing or by the use of a slicer as indicated by the reference symbols 10a to 10f and 11a to 11k to produce bimorph type piezoelectric elements for acceleration sensor, each having a cantilever beam structure provided with a supporting member 8a and a freely vibrating part 7a. (Step f) When the foregoing cutting process is performed, it is needed to use at least one or more of cutting edge and the spacing between the edges has to be determined in consideration of the configuration of the sensor to be produced. In this particular case, a bimorph type piezoelectric element for acceleration sensor of an extremely small size of 2.5 mm long, 0.5 mm wide and 0.4 mm thick has been realized by employing a spacing of 2.5 mm between the respective adjoining reference symbols of 10a to 10f and a spacing of 0.5 mm between the respective adjoining reference symbols of 11a to 11k. Since the length of the freely vibrating part 7a is determined according to the accuracy of grindstones 12a that are employed and also the machine accuracy that is applicable at the time of grinding away and cutting, a very good accuracy of ±3% has been achieved in the variations in sensor sensitivity with the present invention in comparison with the conventional method of fixing the supporting member with the use of adhesives, whereby the variations in sensor sensitivity have been made as wide as ±20%. By employing grindstones 12a for the freely vibrating parts 7a, each measuring 4 mm thick that corresponds to two times the thickness as used in the Third Exemplary Embodiment, the time required in the grinding away process is reduced to one half of that in the Third Exemplary Embodiment. With respect to the average time required to produce a supporting member, it takes 0.005 minutes per a unit of the supporting member according to the present invention, which correspond to a great reduction to 1/100 of the time needed by the conventional method (even when one grind stone is used in the grinding away process). Thus, the present invention can provide a method for manufacturing a bimorph type piezoelectric element of cantilever beam structure for acceleration sensor exhibiting a narrow range of variation in sensitivity and also achieving a low cost.

Industrial Applicability

As described in the above, the present invention relates to a bimorph type piezoelectric element for acceleration sensor formed of a pair of piezoelectric singlecrystal plates put together face to face by direct bonding and characterized by having a structure with a freely vibrating part formed on at least one of the foregoing pair of piezoelectric single-crystal plates by grinding away partially and also a supporting member or supporting members formed of the part that is not applied with a grinding away process and made integral with the foregoing freely vibrating part at one end or both ends thereof, and a manufacturing method that includes:

a first step of direct bonding, whereby the foregoing pair of piezoelectric single-crystal plates are put together face to face and heated;

a second step of forming a freely vibrating part by grinding away at least one of the directly bonded pair of piezoelectric single-crystal plates in the direction of rows or columns at a predetermined spacing to a predetermined depth;

a third step of forming electrodes on the ground away main surface of the foregoing piezoelectric single-crystal plate; and a fourth step of forming supporting members by cutting both the ground away freely vibrating part and the part that is not applied with a grinding away process at a predetermined spacing in the directions of both rows and columns.

Accordingly, a bimorph type piezoelectric element for acceleration sensor that is small in size, high in sensitivity and reduced in variations in sensitivity can be produced at a low cost.

What is claimed is:

1. A biomorph type piezoelectric element including a freely vibrating part and a supporting member, comprising:
   a first piezoelectric single-crystal plate; and
   a second piezoelectric single-crystal plate bonded to the surface of said first piezoelectric single-crystal plate,
   wherein said first piezoelectric single-crystal plate and second piezoelectric single-crystal plate are directly bonded with each other without using any adhesive;
   said supporting member is formed at least on one end of said freely vibrating part;
   wherein said supporting member and at least one of said first piezoelectric single-crystal plate and said second piezoelectric single-crystal plate form a one-piece structure.

2. The bimorph type piezoelectric element according to claim 1,
   wherein said freely vibrating part has a ground away section formed on part of at least one of said first piezoelectric single-crystal plate and second piezoelectric single-crystal plate and
   said ground away section has a thickness controlled by applying a grinding away process to said first piezoelectric single-crystal plate.

3. The bimorph type piezoelectric element according to claim 1,
   wherein said freely vibrating part is a sensor part for detecting an acceleration.

4. The bimorph type piezoelectric element according to claim 1,
   wherein said supporting member is formed on one end of said freely vibrating part.

5. The bimorph type piezoelectric element according to claim 1,
   wherein said supporting member is formed on both ends of said freely vibrating part.

6. The bimorph type piezoelectric element according to claim 1,
   wherein a first thickness of said first piezoelectric single-crystal plate of said vibrating part is almost the same as a second thickness of said second piezoelectric single-crystal.

7. The bimorph type piezoelectric element according to claim 1, further comprising,
   electrodes disposed on both surfaces of said first piezoelectric single-crystal plate and second piezoelectric single-crystal plate that have been bonded with each other.

8. The bimorph type piezoelectric element according to claim 7,
   wherein said electrodes are formed of at least one material selected from Cr/Au and Ti/Au.

9. The bimorph type piezoelectric element according to claim 1,
   wherein said supporting member and freely vibrating part are formed by grinding away at least one of said first piezoelectric single-crystal and second piezoelectric single-crystal plate.

10. The bimorph type piezoelectric element according to claim 1,
    wherein each of said first piezoelectric single-crystal plate and second piezoelectric single-crystal plate is formed of lithium niobate single-crystals, respectively.

11. The bimorph type piezoelectric element according to claim 1,
    wherein each of said first piezoelectric single-crystal plate and second piezoelectric single-crystal plate is formed of lithium niobate single-crystal, respectively, and
    each respective bonding plane of said first piezoelectric single-crystal plate and second piezoelectric single-crystal plate forms a cut out plane of a 120° to 150° rotation Y plate.

12. The bimorph type piezoelectric element according to claim 1,
    wherein each respective bonding plane of said first piezoelectric single-crystal plate and second piezoelectric single-crystal plate is a positively polarized plane.

13. The bimorph type piezoelectric element according to claim 1,
    wherein each respective thickness of said first piezoelectric single-crystal plate and second piezoelectric single-crystal plate that form together said freely vibrating part is the same with each other.

14. A biomorph type piezoelectric element for acceleration sensor formed of a pair of piezoelectric single-crystal plates put together face to face by direct bonding, said biomorph type piezoelectric element comprising:
    a freely vibrating part formed on at least one of said pair of piezoelectric single-crystal plates by grinding away partially; and
    a supporting member formed of the part that is not applied with a grinding away process and made integral with said freely vibrating part at least one end thereof,
    wherein at least one piezoelectric single-crystal plate of said pair of piezoelectric single-crystal plates form a one-piece structure.

15. The biomorph type piezoelectric element of claim 14, wherein said pair of piezoelectric single-crystal plates are formed of lithium niobate single-crystals and the opposing main surface thereof is made as a cutting out plane of 120° to 150° rotation Y plate.

16. The biomorph type piezoelectric element of claim 14, wherein the opposing main surface of each of said pair of piezoelectric single-crystal plates is a positively polarized surface.

17. The biomorph type piezoelectric element of claim 14, wherein each respective plate of said pair of piezoelectric single-crystal plates directly bonded together and forming said freely vibrating part has the same thickness with each other.

* * * * *